United States Patent
Im et al.

(10) Patent No.: US 10,522,782 B2
(45) Date of Patent: Dec. 31, 2019

(54) FLEXIBLE WINDOW AND FLEXIBLE DISPLAY DEVICE INCLUDING THE SAME

(71) Applicant: SAMSUNG DISPLAY CO., LTD., Yongin-si, Gyeonggi-do (KR)

(72) Inventors: Choong Youl Im, Yongin-si (KR); Ivan Maidanchuk, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 246 days.

(21) Appl. No.: 15/795,356

(22) Filed: Oct. 27, 2017

(65) Prior Publication Data

US 2018/0123083 A1 May 3, 2018

(30) Foreign Application Priority Data

Oct. 27, 2016 (KR) .................. 10-2016-0141180

(51) Int. Cl.
| | | |
|---|---|---|
| *H01L 51/52* | (2006.01) | |
| *B32B 27/08* | (2006.01) | |
| *B32B 27/28* | (2006.01) | |
| *B32B 27/40* | (2006.01) | |
| *B32B 7/12* | (2006.01) | |

(Continued)

(52) U.S. Cl.
CPC ............ *H01L 51/5246* (2013.01); *B32B 7/12* (2013.01); *B32B 27/08* (2013.01); *B32B 27/281* (2013.01); *B32B 27/40* (2013.01); *H01L 51/0097* (2013.01); *H01L 51/5281* (2013.01); *H01L 51/56* (2013.01); *B32B 2307/418* (2013.01); *B32B 2457/206* (2013.01);

(Continued)

(58) Field of Classification Search
CPC ............. H01L 51/5246; H01L 51/5281; H01L 51/0097; H01L 51/56; H01L 51/5257; H01L 51/5253; H01L 2251/5338; H01L 27/3244; B32B 27/08; B32B 27/281; B32B 27/40; B32B 7/12; B32B 2457/206; B32B 2307/418

See application file for complete search history.

(56) References Cited

U.S. PATENT DOCUMENTS

| | | | | |
|---|---|---|---|---|
| 2014/0295150 | A1* | 10/2014 | Bower | ............... C09J 5/00 428/201 |
| 2015/0086763 | A1* | 3/2015 | Nam | ............... H01L 51/524 428/212 |
| 2019/0211168 | A1* | 7/2019 | Thompson | ........... C08G 18/672 |

FOREIGN PATENT DOCUMENTS

| | | |
|---|---|---|
| JP | 5633149 B2 | 10/2014 |
| KR | 1020160006585 A | 1/2016 |

(Continued)

*Primary Examiner* — Nancy R Johnson
(74) *Attorney, Agent, or Firm* — Cantor Colburn LLP (57) ABSTRACT

A flexible window includes: a first film layer through which light is incident to the flexible window from a display panel of a flexible display device, the first film layer including: a plurality of stacked first sub-film layers, an adhesive layer disposed between adjacent first sub-film layers, and an index matching layer disposed between a first sub-film layer and the adhesive layer adjacent thereto; and a second film layer on the first film layer to be disposed further from the display panel than the first film layer, the second film layer having a Young's modulus lower than that of each of the first sub-film layers. Within the flexible window, a refractive index of the index matching layer has a value between a refractive index of each of the first sub-film layers and a refractive index of the adhesive layer.

20 Claims, 5 Drawing Sheets

(51) Int. Cl.
*H01L 51/56* (2006.01)
*H01L 51/00* (2006.01)
H01L 27/32 (2006.01)

(52) U.S. Cl.
CPC ...... *H01L 27/3244* (2013.01); *H01L 51/5253* (2013.01); *H01L 51/5275* (2013.01); *H01L 2251/5338* (2013.01)

(56) References Cited

FOREIGN PATENT DOCUMENTS

| KR | 1020160008726 A | 1/2016 |
| KR | 1020160042360 A | 4/2016 |
| KR | 1020170001935 A | 1/2017 |

\* cited by examiner

FLEXIBLE WINDOW AND FLEXIBLE DISPLAY DEVICE INCLUDING THE SAME

This application claims priority to Korean Patent Application No. 10-2016-0141180, filed on Oct. 27, 2016, and all the benefits accruing therefrom under 35 U.S.C. § 119, the content of which in its entirety is herein incorporated by reference.

BACKGROUND

1. Field

The present invention relates to a flexible window and a flexible display device including the same.

2. Description of the Related Art

Representative examples of a display device include a liquid crystal display device and an organic light emitting display device.

In particular, since an organic light emitting display device, unlike a liquid crystal display device, does not require a backlight unit, an overall thickness of the organic light emitting display device can be minimized. Accordingly, research is being conducted on flexible, stretchable, foldable, bendable or rollable organic light emitting display devices.

Such a flexible display device includes a flexible window on a display panel and through which an image is displayed. The flexible window can protect elements of the display device such as the display panel and ensure the flexibility of the display device.

SUMMARY

One or more exemplary embodiment of the invention provides a flexible window having both impact resistance and flexibility and a flexible display device including the flexible window.

One or more exemplary embodiment of the invention also provides a flexible window capable of reducing the reflectance of a flexible display device and a flexible display device including the flexible window.

However, the invention is not restricted to the exemplary embodiments set forth herein. The above and other features of the invention will become more apparent to one of ordinary skill in the art to which the invention pertains by referencing the detailed description of the invention given below.

According to an exemplary embodiment of the invention, there is provided a flexible window including: a first film layer through which light is incident to the flexible window from a display panel of a flexible display device, the first film layer including: a plurality of stacked first sub-film layers, an adhesive layer disposed between adjacent first sub-film layers, and an index matching layer disposed between a first sub-film layer and the adhesive layer adjacent thereto; and a second film layer on the first film layer to be disposed further from the display panel than the first film layer, the second film layer having a Young's modulus lower than that of each of the first sub-film layers. Within the flexible window, a refractive index of the index matching layer has a value between a refractive index of each of the first sub-film layers and a refractive index of the adhesive layer.

According to another exemplary embodiment of the invention, there is provided a flexible display device including: a display panel which displays an image with light; and a flexible window disposed on the display panel, to which the light is incident from the display panel and from which the light exits the flexible display device. The flexible window includes: a first film layer through which the light is incident to the flexible window from the display panel, the first film layer including: a plurality of stacked first sub-film layers, an adhesive layer disposed between adjacent first sub-film layers, and an index matching layer disposed between a first sub-film layer and the adhesive layer adjacent thereto; and a second film layer on the first film layer to be disposed further from the display panel than the first film layer, the second film layer having a Young's modulus lower than that of each of the first sub-film layers. Within the flexible window, a refractive index of the index matching layer has a value between a refractive index of each of the first sub-film layers and a refractive index of the adhesive layer.

BRIEF DESCRIPTION OF THE DRAWINGS

These and/or other features will become apparent and more readily appreciated from the following description of the embodiments, taken in conjunction with the accompanying drawings in which.

DETAILED DESCRIPTION

Features of the invention and methods of accomplishing the same may be understood more readily by reference to the following detailed description of embodiments and the accompanying drawings. The invention may, however, be embodied in many different forms and should not be construed as being limited to the embodiments set forth herein. Rather, these embodiments are provided so that this disclosure will be thorough and complete and will fully convey the invention to those skilled in the art, and the invention will only be defined by the appended claims.

It will be understood that when an element or layer is referred to as being related to another element or layer such as being "on," "connected to" or "coupled to" another element or layer, the element or layer can be directly on, connected or coupled to another element or layer or intervening elements or layers. In contrast, when an element is referred to as being related to another element such as being "directly on," "directly connected to" or "directly coupled to" another element or layer, there are no intervening elements or layers present. As used herein, connected may refer to elements being physically, electrically and/or fluidly connected to each other.

Like numbers refer to like elements throughout. The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the accompanying drawings.

Display devices according to embodiments of the invention may be self-luminous (light-generating) display devices such as an organic light emitting display device and a plasma display device or light-receiving display devices such as a liquid crystal display device and an electrophoresis device.

A display device which is flexible, stretchable, foldable, bendable or rollable may be referred to as a flexible display device. A flexible window of such a flexible display device protects elements of the display device such as the display panel and contributes to the flexibility of the display device. However, if a plurality of individual layers within the flexible window are stacked to give impact resistance and/or flexibility to the flexible window, the reflectance of the flexible display device may increase by such stacked layers.

Hereinafter, a flexible organic light emitting display device will be described as an example of a display device which may be flexible, stretchable, foldable, bendable or rollable, but the invention is not limited to the flexible organic light emitting display device.

Figure 1:
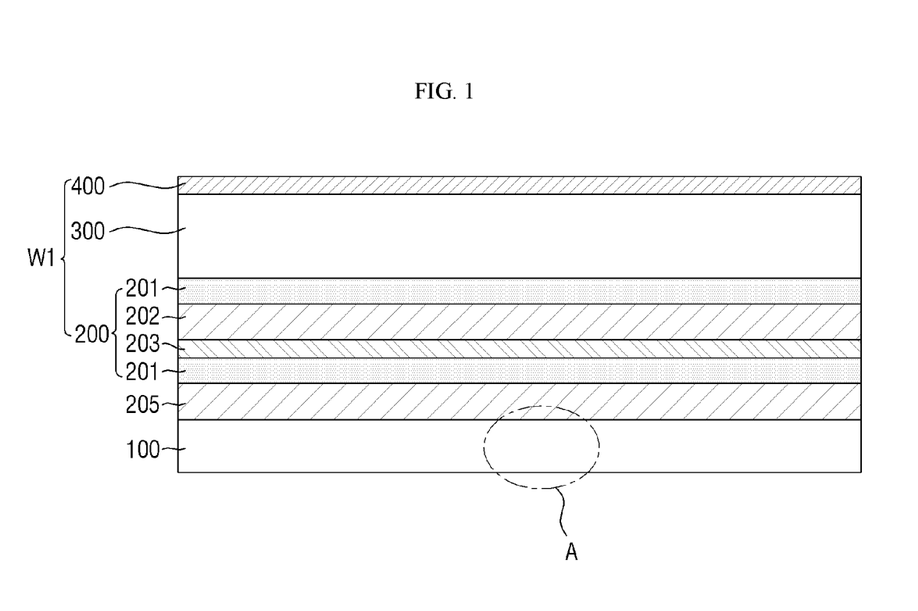
FIG. 1 is a schematic cross-sectional view illustrating an exemplary embodiment of a stacked structure of a flexible display device according to the invention.
Figure 2:
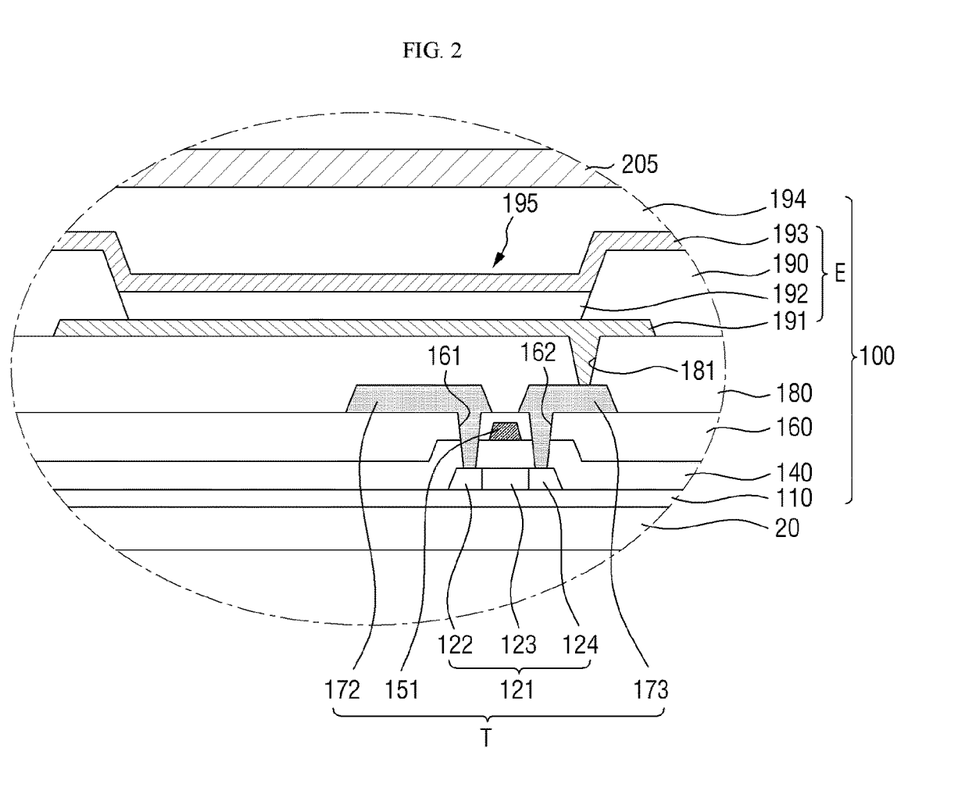
FIG. 2 is an enlarged cross-sectional view of portion A of the flexible display device illustrated in FIG. 1.

FIG. 1 is a schematic cross-sectional view illustrating an exemplary embodiment of a stacked structure of a flexible display device according to the invention. FIG. 2 is an enlarged cross-sectional view of portion A of the flexible display device illustrated in FIG. 1. For a flexible display device disposed in a plane defined by first and second directions, a thickness direction (shown in FIG. 1) crosses both the first and second directions.

Referring to FIGS. 1 and 2, the flexible display device includes a display panel 100 and a flexible window W1 which is disposed on the display panel 100. The flexible window W1 is an outermost component of the flexible display device and forms an outer surface of the overall flexible display device exposed outside thereof. The display panel 100 generates an image using light and displays such image through an upper (display) surface thereof. The image generated by the display panel 100 may be viewable from outside the flexible display device through the flexible window W1. In an embodiment, the display surface of the display panel 100 may extend in a first direction (horizontal in FIG. 1 and FIG. 2 and in a second direction (into the page of FIG. 1 and FIG. 2). Thicknesses of elements of the flexible display device are taken in a third direction, that is, vertical in FIG. 1 and FIG. 2.

The display panel 100 may include a flexible substrate 20, a buffer layer 110, an active layer 121, a gate insulating layer 140, a gate electrode 151, an interlayer insulating layer 160, a source electrode 172, a drain electrode 173, a passivation layer 180, an organic light emitting element E, and an encapsulation layer 194.

The flexible substrate 20 may serve as a base substrate of the display panel 100. The flexible substrate 20 may have a flexible characteristic so that the flexible display device can maintain a display performance thereof even if deformed such as by flexing, stretching, folding, bending or rolling. To this end, the flexible substrate 20 may have a relatively small thickness to be formed relatively thin and may include a material having elasticity.

In an embodiment, the flexible substrate 20 may include polyimide. The flexible substrate 20 can also include a material such as flexible glass.

The buffer layer 110 is disposed on the flexible substrate 20. The buffer layer 110 may be disposed or formed directly on the flexible substrate 20. The buffer layer 110 may include silicon nitride ($SiN_x$), silicon oxide ($SiO_x$), silicon oxynitride ($SiO_xN_y$), or the like and may include or be formed as a single layer or a multilayer. The buffer layer 110 reduces or effectively prevents penetration of impurities, moisture or air from outside the display device which degrades the characteristics of a semiconductor material, and provides a planarized surface within the display panel 100 on which other component layers of the display layer 100 are disposed.

The active layer 121 is disposed on the buffer layer 110. The active layer 121 may include a semiconductor and may include or be made of polysilicon.

The active layer 121 may include or define a channel region 123, and a source region 122 and a drain region 124 located on respective opposing sides of the channel region 123.

The gate insulating layer 140 is disposed on the active layer 121. The gate insulating layer 140 may include or be made of an insulating material such as silicon nitride, silicon oxide, silicon oxynitride or the like, and may include or be formed as a single layer or a multilayer.

The gate electrode 151 is disposed on the gate insulating layer 140. The gate electrode 151 may be connected to a gate line (not illustrated) and a gate pad (not illustrated).

A gate metal layer may include the gate electrode 151, the gate line and the gate pad. The gate metal layer may include aluminum (Al), molybdenum (Mo), copper (Cu), or an alloy of these materials. The gate metal layer can also have a multilayer structure.

The interlayer insulating layer 160 is disposed on the gate electrode 151. The interlayer insulating layer 160 may include or be made of an insulating material such as silicon nitride, silicon oxide, silicon oxynitride or the like, and may be formed as a single layer or a multilayer.

The source electrode 172 and the drain electrode 173 are disposed on the interlayer insulating layer 160. The source electrode 172 may overlap the source region 122 of the active layer 121, and the drain electrode 173 may overlap the drain region 124 of the active layer 121. The source electrode 172 and the drain electrode 173 may be connected to a data line (not illustrated) and a data pad (not illustrated).

A data metal layer may include the source electrode 172, the drain electrode 173 and the data line. The data metal layer may include aluminum (Al), molybdenum (Mo), chromium (Cr), tantalum (Ta), titanium (Ti), other refractory metals, or an alloy of these materials. The data metal layer can also have a multilayer structure.

A source contact hole 161 and a drain contact hole 162 may be disposed or formed in the gate insulating layer 140 and the interlayer insulating layer 160, at which the source electrode 172 and the drain electrode 173 are electrically connected to the source region 122 and the drain region 124 of the active layer 121, respectively.

The active layer 121, the gate electrode 151, the source electrode 172 and the drain electrode 173 of the flexible display device may constitute a switching element such as a thin-film transistor T. The gate electrode 151, which is a control terminal of the thin-film transistor T, may be connected to the gate line, the source electrode 172, which is an input terminal of the thin-film transistor T, may be connected to the data line, and the drain electrode 173, which is an output terminal of the thin-film transistor T, may be connected to an anode 191 of the organic light emitting element E, at and through a contact hole 181.

The passivation layer 180 is disposed or formed on data metal layer, such as on the source electrode 172 and the drain electrode 173. The passivation layer 180 may include silicon nitride, silicon oxide, silicon oxynitride, an acrylic organic compound having a relatively small dielectric constant, benzocyclobutane ("BCB"), or perfluorocyclobutane ("PFCB").

The passivation layer 180 may protect the source electrode 172 and the drain electrode 173 such as during a manufacturing process of the flexible display device, and serve as a planarizing film for planarizing upper surfaces of the source electrode 172 and the drain electrode 173. The contact hole 181 may pass through the passivation layer 180 to expose the drain electrode 173.

The organic light emitting element E is disposed on the passivation layer 180. The organic light emitting element F may include the anode 191, a pixel defining layer 190, an organic light emitting layer 192 and a cathode 193.

The anode 191 is disposed at the bottom of the organic light emitting element E. The anode 191 may be electrically connected to the drain electrode 173 at the contact hole 181 formed in the passivation layer 180 and may serve as a pixel electrode of the organic light emitting element E.

The anode 191 may include a material layer having a relatively high work function, such as indium tin oxide ("ITO"), indium zinc oxide ("IZO"), zinc oxide (ZnO) or indium oxide ($In_2O_3$). Further, the anode 191 may be a stacked layer structure of the above material layers having a relatively high work function and a reflective metal layer including or made of lithium (Li), calcium (Ca), lithium fluoride/calcium (LiF/Ca), lithium fluoride/aluminum (LiF/Al), aluminum (Al), silver (Ag), magnesium (Mg) or gold (Au).

The pixel defining layer 190 is disposed on the anode 191. The pixel defining layer 190 may include a resin material such as polyacrylates or polyimides. The pixel defining layer 190 may define a pixel of the display panel 100 and/or the flexible display device at which light is transmitted and/or an image is displayed. The organic light emitting element F may be disposed at and correspond to the pixel of the display panel 100. The pixel defining layer 190 defines an opening 195 which exposes the anode 191 of the organic light emitting element E.

The organic light emitting layer 192 is disposed on the anode 191 exposed through the opening 195 of the pixel defining layer 190. Although not illustrated, the organic light emitting layer 192 may include or be formed as a multilayer including a light emitting layer ("EML") and one or more of a hole injection layer ("HIL"), a hole transport layer ("HTL"), an electron transport layer ("ETL") and an electron injection layer ("EIL").

The cathode 193 is disposed on the pixel defining layer 190 and the organic light emitting layer 192. The cathode 193 may include Li, Ca, LiF/Ca, LiF/Al, Al, Mg, Ag, Pt, Pd, Ni, Au, Nd, Ir, Cr, BaF, Ba, or a combination of these materials (e.g., including both Ag and Mg). The cathode 193 may serve as a common electrode of the organic light emitting element E. Where the flexible display device and/or display panel 100 include a plurality of pixels, the cathode 193 may be disposed common to each of the plurality of pixels.

The encapsulation layer 194 is disposed on the cathode 193. The encapsulation layer 194 may reduce or effectively prevent moisture or air from penetrating from outside the flexible display device to oxidize the organic light emitting element E within the flexible display device, and may also planarize an upper surface of the cathode 193.

The display panel 100 may further include an attached or embedded touch sensing unit or panel (not illustrated) and/or an attached or embedded polarization unit (not illustrated). In an embodiment, the touch sensing unit may be disposed on the encapsulation layer 194.

The flexible window W1 is disposed on the display panel 100 to protect the display panel 100 from physical impact and infiltration of outside air thereto, to give flexibility to the flexible display device, and to control characteristics such as the reflectance of the entire flexible display device in which the display panel 100 and the flexible window W1 are stacked.

The flexible window W1 may include a first film layer 200 through which light is incident to the flexible window W1 from the display panel 100, a second film layer 300 disposed on the first film layer 200, and a coating layer 400 disposed on the second film layer 300 and through which the light incident to the flexible window W1 exits the flexible window W1 and the display device. The first film layer 200, the second film layer 300 and the coating layer 400 are sequentially disposed in a direction in which light travels from the display panel 100 to be emitted outside the display device via the flexible window W1.

The first film layer 200 may be located at the bottom of the flexible window W1 to be adjacent to and closest to the display panel 100 among layers of the flexible window W1.

The first film layer 200 may include therein a plurality of stacked first sub-film layers 201, an adhesive layer 202 disposed between adjacent first sub-film layers 201, and an index matching layer 203 disposed between any one of the first sub-film layers 201, and the adhesive layer 202, respectively.

The first sub-film layers 201 may have a Young's modulus higher than that of the second film layer 300 and provide improved impact resistance of the flexible window W1.

In an embodiment, the first sub-film layers 201 may include polyimide ("PI"). However, the first sub-film layers 201 can also include a polymer material such as polyethylene terephthalate ("PET"), polycarbonate ("PC") or polymethylmethacrylate ("PMMA") to have a higher Young's modulus than the second film layer 300. The first-sub film layers 201 within the first film layer 200 may each include a same material, but the invention is not limited thereto, as long as each first-sub film layer 201 has a higher Young's modulus than the second film layer 300.

When the first sub-film layers 201 include or are formed of polyimide, a refractive index of each of the first sub-film layers 201 may be adjusted by controlling the molecular structure (shape, size, electron structure, etc.) of monomers such as amine monomers and dianhydride monomers used in the production of polyimide, by introducing and/or changing a functional group, or by controlling heat treatment conditions.

The first sub-film layers 201 may each have a cross-sectional thickness of about 20 micrometers (μm) to about 40 μm. If the thickness of each of the first sub-film layers 201 is less than about 20 μm, impact resistance of the flexible window W1 may be reduced, and reflectance of the flexible window W1 may be increased by optical interference. If the thickness of each of the first sub-film layers 201 exceeds about 40 μm, the flexibility of the flexible window W1 can be reduced.

The adhesive layer 202 may be disposed between adjacent first sub-film layers 201 to attach and fix the first sub-film layers 201 to each other.

In an embodiment, the adhesive layer 202 may include an optical clear adhesive ("OCA"), a pressure sensitive adhesive ("PSA"), or the like.

The adhesive layer 202 may have a cross-sectional thickness of about 40 μm to about 60 μm and may be, but not necessarily, thicker than the first sub-film layer 201.

A lower adhesive layer 205 may be disposed between the flexible window W1 at the first film layer 200 thereof, and the display panel 100. The lower adhesive layer 205 may attach and fix the display panel 100 and the flexible window W1 to each other.

The index matching layer 203 may be disposed between any one of the first sub-film layers 201, and the adhesive layer 202 in the first film layer 200, respectively. The index matching layer 203 reduces the reflection of light incident from outside the flexible display device caused by a difference between a refractive index of the corresponding first sub-film layer 201 and a refractive index of the adhesive layer 202.

The first film layer 200 can secure impact resistance by including therein the first sub-film layers 201 having a relatively high Young's modulus. In addition, since the first film layer 200 has a multilayer structure in which the first sub-film layers 201 are stacked, it can have improved flexibility and bendability, as compared with when having a single layer structure.

However, when the adhesive layer 202 disposed between the first sub-film layers 201 to form a stack of the first sub-film layers 201 has a different refractive index from the first sub-film layers 201, the reflectance of the flexible display device can be undesirably increased due to optical interference.

When light travels from the air (e.g., outside the display device) to a stack of two refraction layers, a relational expression (Fresnel equation) between a refraction index of each refraction layer and reflectance is as follows. In the following relational expression, R denotes reflectance, no denotes a refractive index (=1) of air, and $n_1$ and $n_2$ respectively denote refractive indices of the two refraction layers.

$$R \approx \left(\frac{n_0 n_2 - n_1^2}{n_0 n_2 + n_1^2}\right)^2 = \left(\frac{n_2 - n_1^2}{n_2 + n_1^2}\right)^2. \tag{1}$$

A refractive index of the index matching layer 203 may have a value between the refractive index of each of the first sub-film layers 201 and the refractive index of the adhesive layer 202 and reduce the reflectance of the flexible display device according to the relational expression.

In an embodiment, the refractive index of each of the first sub-film layers 201 may be about 1.7, and the refractive index of the adhesive layer 202 may be about 1.42. In addition, the refractive index of the index matching layer 203, which can optimally reduce the reflectance of the flexible display device according to the relational expression, may be about 1.3 to about 1.6. In an exemplary embodiment, the refractive index of the index matching layer 203 may be about 1.42 to about 1.6.

The index matching layer 203 may include an inorganic material such as $SiO_2$, SiOC, SiOF or siloxane, or an organic material such as an acrylic material, polyimide, polycarbonate or polymethyl methacrylate.

In an embodiment, if the index matching layer 203 includes the organic material, the index matching layer 203 may have homogeneity with the material that forms an adjacent first sub-film layer 201 and the adhesive layer 202. Thus, the adhesion of the index matching layer 203 to the adjacent first sub-film layer 201 and/or the adhesive layer 202 can be increased.

The index matching layer 203 may have a cross-sectional thickness of about 0.5 μm to about 2 μm. The cross-sectional thickness of the index matching layer 203 may be, but not necessarily, smaller than the cross-sectional thickness of each of the first sub-film layers 201 and/or the adhesive layer 202.

The second film layer 300 has a Young's modulus lower than that of the first sub-film layers 201. The second film layer 300 may give flexibility or bendability to the flexible window W1.

In an embodiment, the second film layer 300 may include polyurethane ("PU"). However, the second film layer 300 can also include a polymer material such as polyethylene terephthalate, polycarbonate or polymethylmethacrylate to have a lower Youngs modulus than the first film layer 200.

The second film layer 300 may be attached to such as being coated on the first sub-film layer 201 located at the top of the first film layer 200 without an adhesive material therebetween. Accordingly, the second film layer 300 and the uppermost first sub-film layer 201 may be in direct contact with each other.

The second film layer 300 may have a cross-sectional thickness of about 150 μm to about 300 μm. The thickness of the second film layer 300 may be, but not necessarily, greater than that of each of the first sub-film layers 201 and the adhesive layer 202. If the thickness of the second film layer 300 is less than about 150 μm, the impact resistance of the flexible window W1 may be reduced, and foreign substances may be introduced to underlying layers of the display device. If the thickness of the second film layer 300 exceeds about 300 μm, the flexibility of the flexible window W1 may be reduced.

The coating layer 400 may be coated on the second film layer 300 and include one or more of a relatively hard coating layer, an anti-fingerprint ("AF") coating layer, an anti-reflection ("AR") coating layer and an anti-glare ("AG") coating layer. The coating layer 400 of the flexible window W1 may define an outer surface of the flexible display device.

In an embodiment, the coating layer 400 may be an AF coating layer including fluorine such as in a fluorine (F) compound. Therefore, the coating layer 400 can reduce or effectively prevent optical interference at the flexible window W1 and reduce or effectively prevent foreign substances from being adsorbed onto the flexible window W1.

The coating layer 400 may have a thickness of about 600 angstroms (Å) to about 1200 Å, specifically, about 800 Å to about 1000 Å. When the coating layer 400 has a thickness within the above range, an effect of reducing the reflectance of the flexible window W1 can be maximized.

Figure 3:
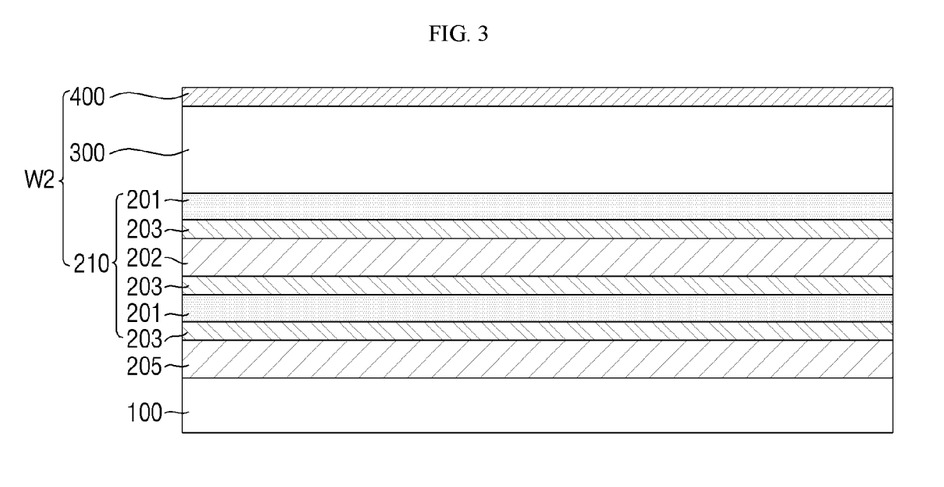
FIGS. 3 through 5 are schematic cross-sectional views respectively illustrating other exemplary embodiments of stacked structures of a flexible display device according to the invention.

FIG. 3 is a schematic cross-sectional view illustrating another exemplary embodiment of a stacked structure of a flexible display device according to the invention.

A flexible window W2 of FIG. 3 is the same as the flexible window W1 described above with reference to FIG. 1, except that an index matching layer 203 is disposed between each pair of a first sub-film layer 201 and an adhesive layer 202 adjacent to each other. Thus, any redundant description will be omitted.

Referring to FIG. 3, a first film layer 210 may collectively include the index matching layer 203 disposed between each pair of the first sub-film layer 201 and the adhesive layer 202.

Since the index matching layer 203 is disposed between each pair of the first sub-film layer 201 and the adhesive layer 202 which is adjacent to the first sub-film layer 201, the reflectance of the flexible display device can be greatly reduced.

The index matching layer 203 may also be disposed between a first sub-film layer 201 located at the bottom of the first film layer 210 and a lower adhesive layer 205.

A refractive index of the index matching layer 203 may have a value between a refractive index of each of the first sub-film layers 201 and a refractive index of the adhesive layer 202. In some embodiments, the refractive index of the index matching layer 203 may be 1.3 to 1.6, as described above with reference to FIG. 1.

Figure 4:
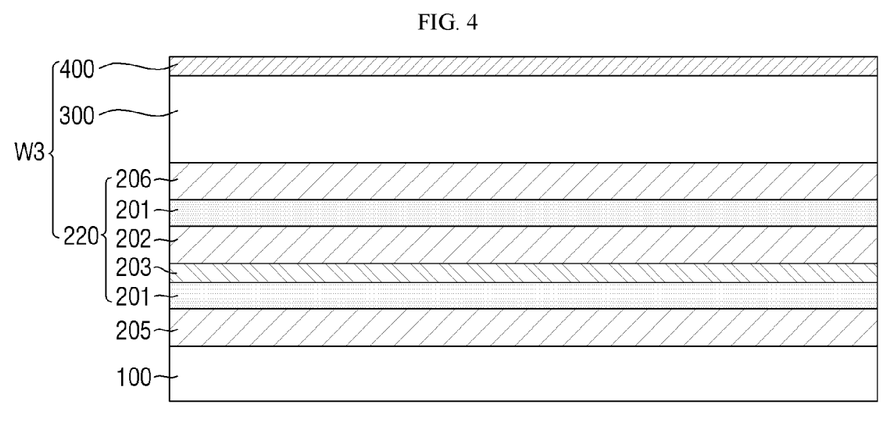

FIG. 4 is a schematic cross-sectional view illustrating still another exemplary embodiment of a stacked structure of a flexible display device according to the invention.

The flexible display device of FIG. 4 is the same as the flexible display device of FIG. 1 except that an upper adhesive layer 206 is disposed between a first sub-film layer 201 located at the top of a first film layer 220 and a second film layer 300. Thus, any redundant description will be omitted.

Referring to FIG. 4, when the second film layer 300 of a flexible window W3 is not a coated layer like the coating layer 400 coated on the first film layer 220, but instead is a film layer such as separately formed from other layers of the flexible window W3, the first film layer 220 may further include the upper adhesive layer 206 disposed on an uppermost layer adjacent to the second film layer 300.

The upper adhesive layer 206 may include or be formed of a film layer to fix the second film layer 300 having insufficient adhesion to the first film layer 220 without an upper adhesion layer, so that the second film layer 300 does not peel off from the first film layer 220.

Like the adhesive layer 202 described above, the upper adhesive layer 206 may include an OCA, a PSA or the like.

Like the adhesive layer 202 described above, the upper adhesive layer 206 may have a cross-sectional thickness of about 40 μm to about 60 μm. The thickness upper adhesive layer 206 may be, but not necessarily, greater than that of each of the first sub-film layers 201.

Figure 5:
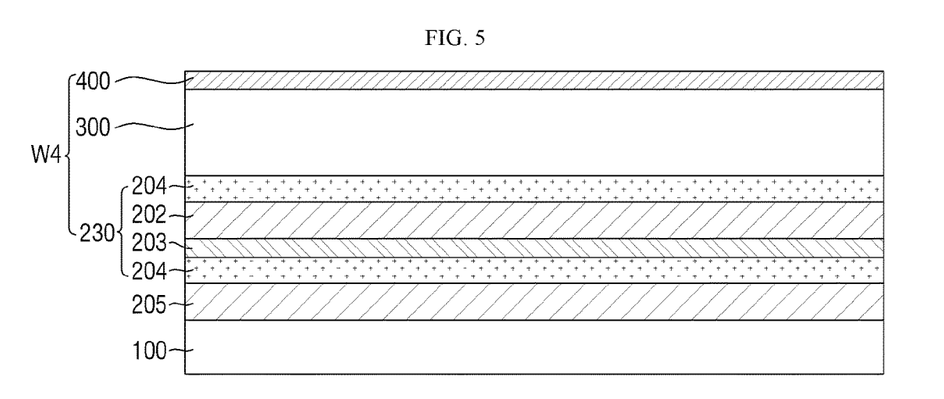

FIG. 5 is a schematic cross-sectional view illustrating yet another exemplary embodiment of a stacked structure of a flexible display device according to the invention.

A flexible window W4 of FIG. 5 is the same as the flexible window W1 of FIG. 1, except that a refractive index of each of a plurality of first sub-film layers 204 has a similar value to a refractive index of an adhesive layer 202. Thus, any redundant description will be omitted.

Referring to FIG. 5, the refractive index of each of the first sub-film layers 204 may have a similar value to the refractive index of the adhesive layer 202. Specifically, the refractive index of each of the first sub-film layers 204 may be adjusted to be different from the refractive index of the adhesive layer 202 by about 0.2 or less, so as to be considered a "similar value." Accordingly, the reflection of light due to optical interference can be reduced.

In an embodiment, each of the first sub-film layers 204 may include polyimide, and the refractive index of each of the first sub-film layers 204 may be adjusted by controlling the molecular structure (shape, size, electron structure, etc.) of monomers such as amine monomers and dianhydride monomers used in the production of polyimide, by introducing and/or changing a functional group, or by controlling heat treatment conditions.

The refractive index of each of the first sub-film layers 204 may be adjusted by changing the physical properties, material, etc. of the first sub-film layers 201 described above.

As similarly discussed above, a refractive index of the index matching layer 203 may have a value between the refractive index of each of the first sub-film layers 204 and the refractive index of the adhesive layer 202 and reduce the reflectance of the flexible display device according to the relational expression described above. In an embodiment, the refractive index of the index matching layer 203, which can optimally reduce the reflectance of the flexible display device according to the relational expression, may be about 1.3 to about 1.6. In an exemplary embodiment, the refractive index of the index matching layer 203 may be about 1.42 to about 1.6.

The thicknesses of the layers described above may be considered as a maximum thickness for the respective layer.

Hereinafter, experimental examples for maximizing a reduction in the reflectance of a flexible display device according to an embodiment by adjusting a cross-sectional thickness of a material layer formed by coating a material onto a layer within the flexible display device will be described.

Manufacturing Example 1

An organic light emitting display panel, a first PSA layer having a refractive index of 1.46 and a thickness of 50 μm, a first polyimide layer having a refractive index of 1.64 and a thickness of 30 μm, a second PSA layer having a refractive index of 1.46 and a thickness of 50 μm, a second polyimide layer having a refractive index of 1.64 and a thickness of 30 μm, and a coated polyurethane material layer having a refractive index of 1.5 and a thickness of 200 μm were sequentially stacked.

Then, an AF coated layer having a refractive index of 1.4 was formed (e.g., coated) on the polyurethane coated layer by varying the cross-sectional thickness of the AF coating layer by 200 Å in a range from 0 to 1200 Å. In this way, various exemplary embodiments of a flexible display device was manufactured according to the invention.

Manufacturing Example 2

A flexible display device was manufactured in the same way as in Manufacturing Example 1 except that a SiO$_2$ layer having a refractive index of 1.5 and a thickness of 1 μm was added between the first polyimide layer and the second PSA layer.

Manufacturing Example 3

A flexible display device was manufactured in the same way as in Manufacturing Example 1 except that a SiO$_2$ layer having a refractive index of 1.5 and a thickness of 1 μm was added between the first polyimide layer and the second PSA layer and that the refractive index of each of the first and second polyimide layers was changed to 1.55.

Comparative Example

A flexible display device was manufactured in the same way as in Manufacturing Example 1 except that the AF coating layer was omitted.

Experimental Example

Figure 6:
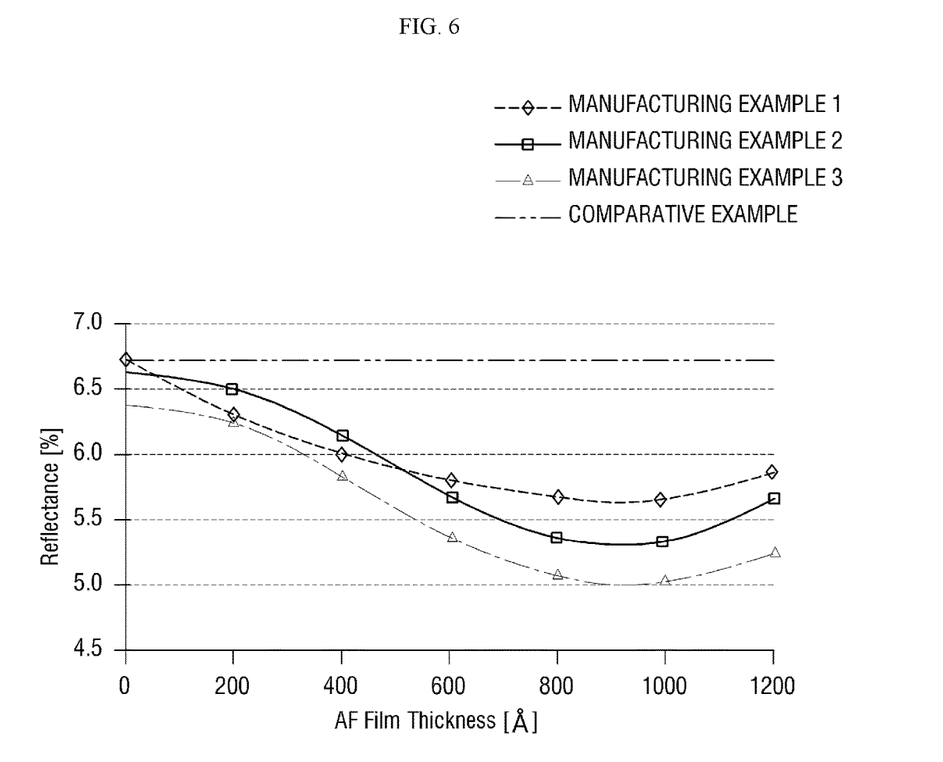
FIG. 6 is a graph illustrating the results of measuring reflectance of exemplary embodiments of flexible display devices according to Manufacturing Examples 1 through 3 and according to a Comparative Example.

The reflectance in percent (%) of each of the exemplary embodiments of the flexible display devices according to Manufacturing Examples 1 through 3 and Comparative Example was measured, relative to a thickness in Å of the AF coated layer, and measurement results were obtained as illustrated in a graph of FIG. 6.

Referring to the graph of FIG. 6, the reflectance of each of the flexible display devices according to Manufacturing Examples 1 through 3 is lower than that of the flexible display device according to Comparative Example, varies depending on the thickness of the uppermost AF coating layer, and is lowest when the thickness of the AF coating layer is 600 Å to 1200 Å.

One or more exemplary embodiments of the invention provides at least one of the following advantages.

It is possible to secure both impact resistance and flexibility of a flexible display device through a flexible window which is disposed within the flexible display device and within which a first film layer having a relatively high Young's modulus and a multilayer structure, and a second film layer having a relatively low Young's modulus, are stacked.

Further, the reflectance of the flexible display device can be reduced through an index matching layer, a coating layer, etc.

However, the effects of the invention are not restricted to the one set forth herein. The above and other effects of the invention will become more apparent to one of daily skill in the art to which the invention pertains by referencing the claims.

While the invention has been particularly illustrated and described with reference to exemplary embodiments thereof, it will be understood by those of ordinary skill in the art that various changes in form and detail may be made therein without departing from the spirit and scope of the invention as defined by the following claims. The exemplary embodiments should be considered in a descriptive sense only and not for purposes of limitation.

What is claimed is:
1. A flexible window comprising:
a first film layer through which light is incident to the flexible window from a display panel of a flexible display device, the first film layer comprising:
a plurality of stacked first sub-film layers,
an adhesive layer disposed between adjacent first sub-film layers, and
an index matching layer disposed between a first sub-film layer and the adhesive layer adjacent thereto; and
a second film layer which is on the first film layer to be disposed further from the display panel than the first film layer, the second film layer having a Young's modulus lower than that of each of the first sub-film layers,
wherein within the flexible window, a refractive index of the index matching layer has a value between a refractive index of each of the first sub-film layers and a refractive index of the adhesive layer.

2. The flexible window of claim 1, wherein a thickness of each of the first sub-film layers is less than that of the second film layer.

3. The flexible window of claim 1, wherein for the adhesive layer disposed between the adjacent first sub-film layers, a difference between the refractive index of each of the first sub-film layers and the refractive index of the adhesive layer is about 0.2 or less.

4. The flexible window of claim 1, wherein the index matching layer comprises an organic material.

5. The flexible window of claim 1, wherein the refractive index of the index matching layer disposed between the first sub-film layer and the adhesive layer adjacent thereto is about 1.3 to about 1.6.

6. The flexible window of claim 1, wherein a first sub-film layer disposed furthest from the display panel among the plurality of stacked first sub-film layers is in direct contact with the second film layer.

7. The flexible window of claim 1, further comprising a coating layer which is disposed on the second film layer, the coating layer disposed further from the display panel than the second film layer to define an outer surface of the flexible display device.

8. The flexible window of claim 7, wherein the coating layer comprises fluorine.

9. The flexible window of claim 7, wherein a thickness of the coating layer is about 600 angstroms to about 1200 angstroms.

10. The flexible window of claim 1, wherein the first sub-film layers comprise polyimide.

11. The flexible window of claim 1, wherein the second film layer comprises polyurethane.

12. A flexible display device comprising:
a display panel which displays an image with light; and
a flexible window disposed on the display panel, to which the light is incident from the display panel and from which the light exits the flexible display device,
the flexible window comprising:
a first film layer through which the light is incident to the flexible window from the display panel, the first film layer comprising:
a plurality of stacked first sub-film layers,
an adhesive layer disposed between adjacent first sub-film layers, and
an index matching layer disposed between a first sub-film layer and the adhesive layer adjacent thereto; and
a second film layer which is on the first film layer to be disposed further from the display panel than the first film layer, the second film layer having a Young's modulus lower than that of each of the first sub-film layers,
wherein within the flexible window, a refractive index of the index matching layer has a value between a refractive index of each of the first sub-film layers and a refractive index of the adhesive layer.

13. The flexible display device of claim 12, wherein the display panel on which the flexible window is disposed comprises a flexible substrate, a thin-film transistor disposed on the flexible substrate, and an organic light emitting element disposed on the thin-film transistor.

14. The flexible display device of claim 12, wherein for the adhesive layer disposed between the adjacent first sub-film layers of the flexible widow, a difference between the refractive index of each of the first sub-film layers and the refractive index of the adhesive layer is about 0.2 or less.

15. The flexible display device of claim 12, wherein the index matching layer comprises an organic material.

16. The flexible display device of claim 12, wherein the refractive index of the index matching layer disposed between the first sub-film layer and the adhesive layer adjacent thereto of the flexible window is about 1.3 to about 1.6.

17. The flexible display device of claim 12, wherein the flexible window further comprises a coating layer which is disposed on the second film layer, the coating layer disposed further from the display panel than the second film layer to define an outer surface of the flexible display device.

18. The flexible display device of claim 17, wherein the coating layer comprises fluorine.

19. The flexible display device of claim 17, wherein a thickness of the coating layer is about 600 angstroms to about 1200 angstroms.

20. The flexible display device of claim 12, wherein the first sub-film layers comprise polyimide.

* * * * *